(12) United States Patent
Kwong et al.

(10) Patent No.: US 6,335,638 B1
(45) Date of Patent: Jan. 1, 2002

(54) TRIPLE-SLOPE CLOCK DRIVER FOR REDUCED EMI

(75) Inventors: David Kwong, Fremont; Kwong Shing Lin, Sunnyvale, both of CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/607,558

(22) Filed: Jun. 29, 2000

(51) Int. Cl.[7] .............................. G06F 1/04; H03K 3/00
(52) U.S. Cl. ..................... 326/83; 326/28; 327/291; 327/298
(58) Field of Search ........................ 326/82, 83, 26, 326/27, 28; 327/291, 298, 170, 374, 376

(56) References Cited

U.S. PATENT DOCUMENTS

| | | | |
|---|---|---|---|
| 4,806,794 A | 2/1989 | Walters, Jr. .................. 307/451 |
| 4,815,113 A | 3/1989 | Ludwig et al. ................ 377/39 |
| 4,827,159 A | 5/1989 | Naganuma ................... 307/443 |
| 4,829,199 A * | 5/1989 | Prater .......................... 326/27 |
| 4,939,389 A | 7/1990 | Cox et al. .................... 307/443 |
| 5,013,940 A | 5/1991 | Ansel .......................... 307/473 |
| 5,070,256 A | 12/1991 | Grondalski ................. 307/270 |
| 5,134,311 A | 7/1992 | Biber et al. ................. 307/270 |
| 5,278,464 A | 1/1994 | Pelley, III et al. .......... 307/455 |
| 5,319,258 A | 6/1994 | Ruetz ......................... 307/443 |
| 5,337,254 A | 8/1994 | Knee et al. .................. 364/489 |
| 5,534,790 A | 7/1996 | Huynh et al. ................ 326/27 |
| 5,568,081 A | 10/1996 | Lui et al. .................... 327/380 |
| 5,621,335 A | 4/1997 | Andresen ..................... 326/30 |
| 5,717,343 A | 2/1998 | Kwong ......................... 326/27 |
| 5,760,620 A * | 6/1998 | Doluca ........................ 327/112 |
| 5,808,478 A | 9/1998 | Andersen ..................... 326/31 |
| 5,920,210 A | 7/1999 | Kaplinsky .................... 327/112 |
| 5,959,481 A | 9/1999 | Donnelly et al. ............ 327/170 |
| 5,963,047 A | 10/1999 | Kwong et al. ................ 326/27 |
| 6,215,328 B1 * | 4/2001 | Nasu ........................... 326/83 |

OTHER PUBLICATIONS

Lee & Hajimiri, "Oscillator Phase Noise: A Tutorial", IEEE JSSC vol. 35, No. 3, Mar. 2000, pp. 326–335.

* cited by examiner

*Primary Examiner*—Michael Tokar
*Assistant Examiner*—Daniel D. Chang
(74) *Attorney, Agent, or Firm*—Stuart T. Auvinen

(57) ABSTRACT

A clock driver for an integrated circuit reduces electromagnetic interference (EMI) induced in nearby metal traces yet also reduces jitter due to noise at the switching threshold. A weak driver using small n-channel and p-channel transistors initially drives the clock line. Then a pulse generator produces a short pulse to a gate of a large driver transistor. The large driver transistor is pulsed on for a very short period of time. The large driver transistor is turned off by the end of the pulse before the clock line completes its transition. The weak driver then finishes the clock-line transition. Since only the weak driver is on during the start and end of the transition, a slow voltage-slew rate occurs at the beginning and end of the transition. The large driver transistor is on only in the middle of the transition, producing a fast voltage-slew rate in the middle. A triple-slope waveform results. Since a fast voltage-slew occurs in the middle of the transition near the receiver's switching threshold, clock jitter due to supply noise is reduced. EMI is reduced because the average slew rate is reduced.

19 Claims, 7 Drawing Sheets

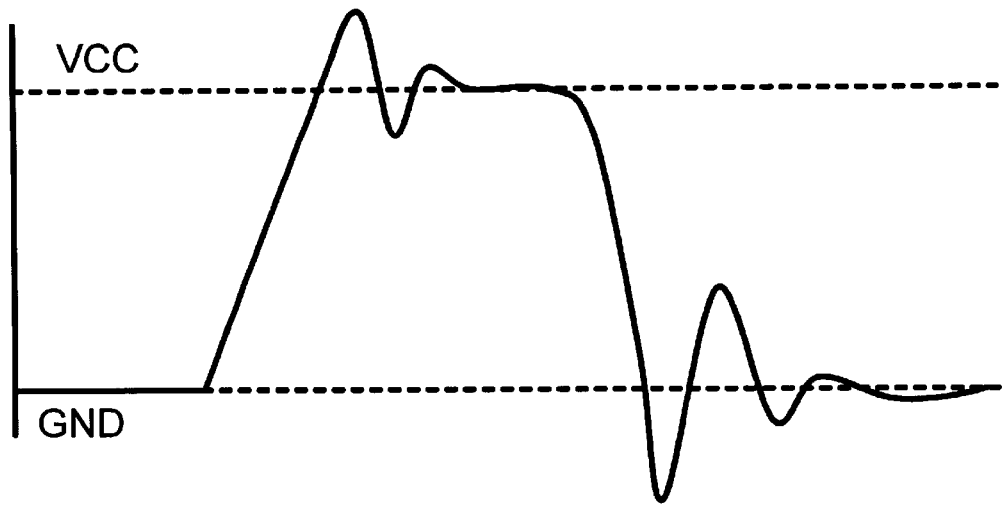
PRIOR ART  FIG. 1
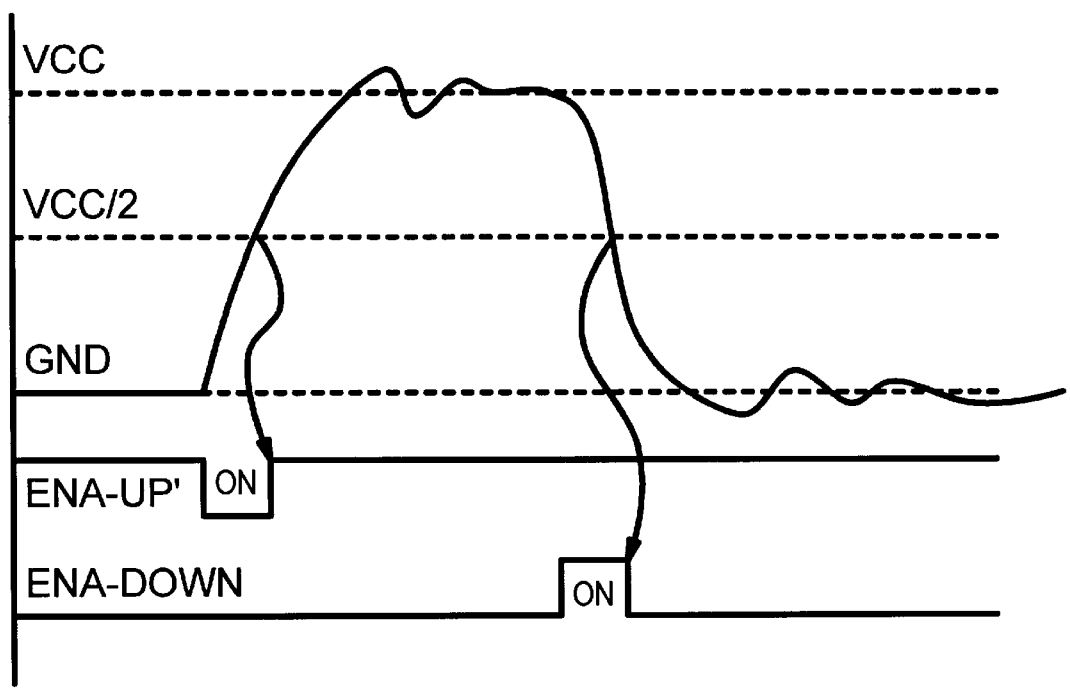
PRIOR ART  FIG. 2

3-STAGE

TRIPLE-SLOPE CLOCK DRIVER FOR REDUCED EMI

FIELD OF THE INVENTION

This invention relates to CMOS clock buffers, and more particularly to low-noise controlled-slope clock buffers.

BACKGROUND OF THE INVENTION

Significant advances in semiconductor process technology have allowed for large numbers of transistors to be integrated together on large-scale-integration (LSI) integrated circuits (ICs). These LSI chips typically use complementary metal-oxide-semiconductor (CMOS) process technology. Synchronous designs such as state machines are often employed, requiring clocks to be distributed over the chip to latch elements.

Large, high-current-drive clock buffers are needed to drive the large capacitive load of the clock inputs to the many latch elements, and the long metal clock-line traces. Higher current drive increases speed because load capacitances are more quickly charged or discharged. Unfortunately, unwanted interference and noise often increase too.

The high density of these LSI chips is in part due to tight spacing among metal traces. Adjacent metal traces can pick up noise from clock lines by capacitive coupling of rapid voltage changes. Such electromagnetic interference (EMI) tends to increase as higher densities and faster transistors are used.

The rate of voltage change of the clock signal, the edge rate, increases for these faster devices. The high edge rate transition can also reflect off the ends of metal wiring traces driven by the clock buffer. These reflections produce voltage variations known as undershoot, overshoot, and ringing (oscillation).

FIG. 1 is a diagram of a waveform of a prior-art high-drive clock buffer driving a long metal wiring trace. The high current drive of the clock buffer produces a high edge rate which rapidly changes the clock line voltage from ground to the power-supply voltage, Vcc. The high edge rate produces EMI interference with other adjacent metal traces, causing voltage changes on these adjacent lines. Ringing due to reflections can also occur on the clock line.

The EMI can be reduced by slowing down the edge of the clock transition, such as by using a weaker clock driver. However, the weaker clock driver will then be more susceptible to jitter from sources such as supply noise. The clock edge requires more time to pass through the switching threshold, causing greater noise susceptibility. Of course, the weaker clock driver also increases clock delay and thus slows down the chip.

The co-inventor has solved a somewhat related problem of ground bounce on output buffers by pulsing large output driver transistors on and off. See "A High-Drive CMOS Output Buffer with Noise Supression Using Pulsed Drivers and Neighbor-sensing", by Kwong, U.S. Pat. No. 5,717,343, assigned to Pericom Semiconductor Corp. of San Jose, Calif. The output is driven by both large and small transistors. The small transistors are enabled and disabled normally by inverters. However, the larger driver transistors are pulsed on just briefly at the start of a transition, and are quickly disabled at the mid-point of the transition.

FIG. 2 is a waveform of an output buffer that enables the larger transistors only during the first part of the voltage transition. When internal input signal IN changes, indicating that the output should change, the large driver transistor is enabled. Signal ENA-UP' drives the gate of a large PMOS pull-up transistor, while signal ENA-DOWN drives the gate of a large NMOS pull-down transistor. As the output voltage reaches the logic switching threshold, about Vcc divided by 2, the large driver transistor is disabled and the smaller driver transistor continues to drive the signal to either power or ground. The rate of voltage change is reduced as the output voltage approaches the power-supply or ground voltage. This reduction in edge rate occurs after the switching threshold is reached, and thus does not slow down switching delays. The softer edge reduces the reflection and thus ringing, overshoot, and undershoot are also reduced.

What is desired is a clock buffer with high current drive and high speed but reduced EMI. It is desired to reduce jitter on the clock by rapidly switching the clock output near the switching threshold, but still reduce EMI by more slowly switching the output away from the switching threshold. It is desired to reduce induced EMI from the fast edge rate. It is desired to dynamically control the edge rate of the clock buffer to provide high drive and rapid voltage change near the receiver's switching threshold, but lower drive and a slower voltage change for the remainder of the transition. It is further desired to pulse large driver transistors on only during the middle of the transition so that the large driver transistors are off at the start and at the end of the transition.

SUMMARY OF THE INVENTION

A reduced-jitter and reduced-electro-magnetic interference (EMI) clock driver has a clock input, a clock output, and a driver p-channel transistor with a source coupled to a power supply and a drain coupled to the clock output and a gate coupled to a first gate node. A weak p-channel transistor has a source coupled to the power supply and a drain coupled to the clock output and a gate coupled to a weak-gate node. The weak-gate node is buffered from the clock input by at least one inverter.

A first large inverter drives a first pass node with an inverse of the clock input. A first pulsing circuit is responsive to the clock input. It generates a first pulse when the clock input changes from low to high logic states. A first pass transistor has a gate that receives the first pulse. It connects the first pass node to the first gate node in response to the first pulse.

A first disable transistor is coupled to the first gate node. It drives a disabling voltage onto the first gate node when the first pulse is not active. A driver n-channel transistor has a source coupled to a ground and a drain coupled to the clock output and a gate coupled to a second gate node. A weak n-channel transistor has a source coupled to the ground and a drain coupled to the clock output and a gate coupled to the weak-gate node.

A second large inverter drives a second pass node with an inverse of the clock input. A second pulsing circuit is responsive to the clock input. It generates a second pulse when the clock input changes from high to low logic states.

A second pass transistor has a gate receiving the second pulse. It connects the second pass node to the second gate node in response to the second pulse. A second disable transistor is coupled to the second gate node. It drives a disabling voltage onto the second gate node when the second pulse is not active. Thus driver transistors are pulsed.

In further aspects of the invention, pulsing the driver n-channel and p-channel transistors reduces jitter near a mid-point of a transition by increasing a voltage-slew rate near the mid-point, but reduces overall EMI by disabling the n-channel and p-channel driver transistors before and after the mid-point. Thus jitter and EMI are reduced.

In still further aspects, the driver n-channel transistor has a larger current drive than the weak n-channel transistor. The driver p-channel transistor has a larger current drive than the weak p-channel transistor.

BRIEF DESCRIPTION OF THE DRAWINGS

FIG. 1 is a diagram of a waveform of a prior-art high-drive clock buffer driving a long metal wiring trace.

FIG. 2 is a waveform of an output buffer that enables the larger transistors only during the first part of the voltage transition.

DETAILED DESCRIPTION

The present invention relates to an improvement in CMOS clock drivers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that induced EMI can be reduced by reducing the edge rate, or rate of voltage change on a clock line driven by a clock driver. However, reducing the edge rate has the negative effect of increasing clock jitter.

The inventors have realized that jitter occurs on a clock line driven by a clock buffer because of supply and substrate noise. This noise is typically small, being much less than a volt. Thus clock jitter does not occur when the clock is near the high or low voltage-supply levels. However, when the clock line is near the switching threshold of the receivers, small voltage changes due to such noise can falsely trigger and re-trigger the receivers. Thus noise is a problem only when the clock line is near the switching threshold.

The inventors therefore realize that the ideal clock waveform has a rapid voltage change near the receiver's switching threshold, a slower edge rate to reduce EMI when the clock's voltage is away from the switching threshold. Jitter is reduced because the clock line rapidly moves through the switching threshold, so less time is spent with the clock signal near the critical switching threshold where small noise voltages could falsely trigger receivers. EMI is reduced, since the overall or average edge rate is reduced due to the slower edge rate when the clock signal is not near the switching threshold.

Figure 3:
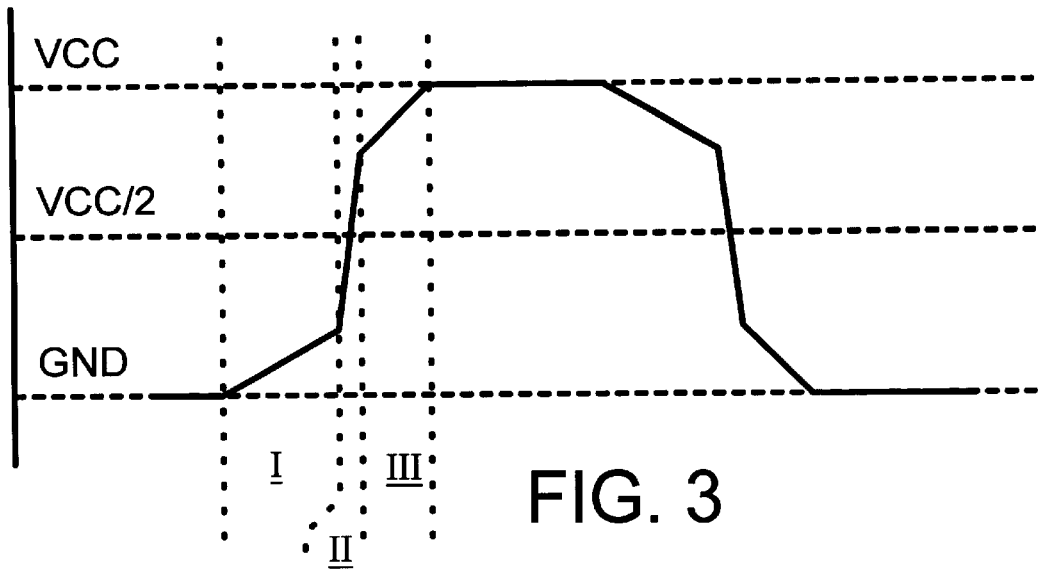
FIG. 3 shows a triple-slope clock waveform with reduced jitter and reduced EMI generation.

Triple-Slope Clock Waveform—FIG. 3

FIG. 3 shows a triple-slope clock waveform with reduced jitter and reduced EMI generation. The receivers of the clock waveform have a switching threshold of about Vcc/2. The initial edge rate in region I is low, producing low EMI induction. However, as the clock voltage rises to near Vcc/2, the edge rate increases dramatically. In region II, the high edge rate allows the clock's voltage to rapidly cross over the switching threshold of Vcc/2, minimizing the time in which noise can upset the clock. Once the clock voltage rises past Vcc/2, the edge rate is dramatically reduced, and in region m the lower edge rate produces lower EMI induction. Since region II accounts for only 40 to 60 percent of the transition, the average EMI for the whole transition is reduced.

A triple-slope clock waveform such as shown can result when only a small driver transistor drives the clock output during regions I and III, but a large driver transistor drives the output in region II. The same kind of three-sloped waveform occurs for the falling edge of the clock as shown. Since the large driver transistor is enabled during region II, the large current is able to quickly offset any noise coupled into the clock line.

Of course, the amount of time that the clock waveform is in region II is quite short. This requires an extremely short pulse to enable the large driver transistor. Special pulse circuitry is needed to generate such a short pulse in a controllable manner. The detailed transistor configuration for such a short pulse generator is shown later in FIGS. 8, 9.

Figure 4:
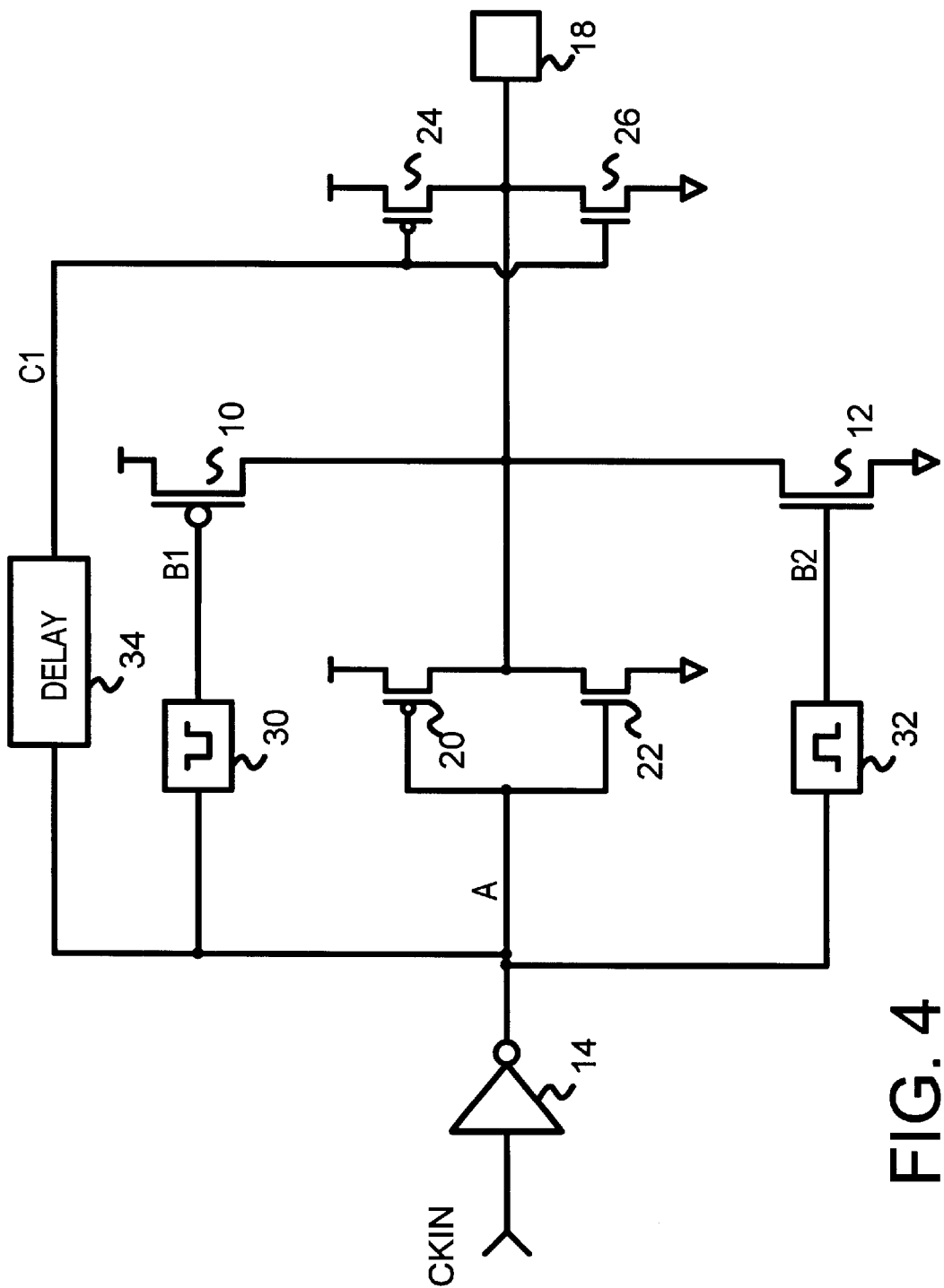
FIG. 4 is a block diagram of a 3-stage clock buffer that produces a clock with a triple-slope waveform.

3-Stage Clock Generator—FIG. 4

FIG. 4 is a block diagram of a 3-stage clock buffer that produces a clock with a triple-slope waveform. Input CKIN is inverted by inverter 14 to drive weak first stage transistors 20, 22. Weak first stage transistors 20, 22 drive clock output 18, which is a large capacitance clock line.

Pulse generator 30 is activated by the output of inverter 14 (node A) going low, and drives the gate (node B1) of p-channel driver transistor 10. P-channel driver transistor 10 then rapidly drives clock output 18 high during the high-edge-rate region II of the switching waveform. Likewise, pulse generator 32 is activated by the output of inverter 14 (node A) going high, and drives the gate (node B2) of n-channel driver transistor 12. N-channel driver transistor 12 rapidly switches clock output 18 low during region II of the falling transition.

Delay line 34 receives the output of inverter 14, node A, and generates node C1. Node C1 drives the gates of third-stage transistors 24, 26. Clock output 18 is driven by weak third-stage transistors 24, 26 during region III. Weak first stage transistors 20, 22 also continue to drive clock output 18 during phases II and III.

Figure 5:
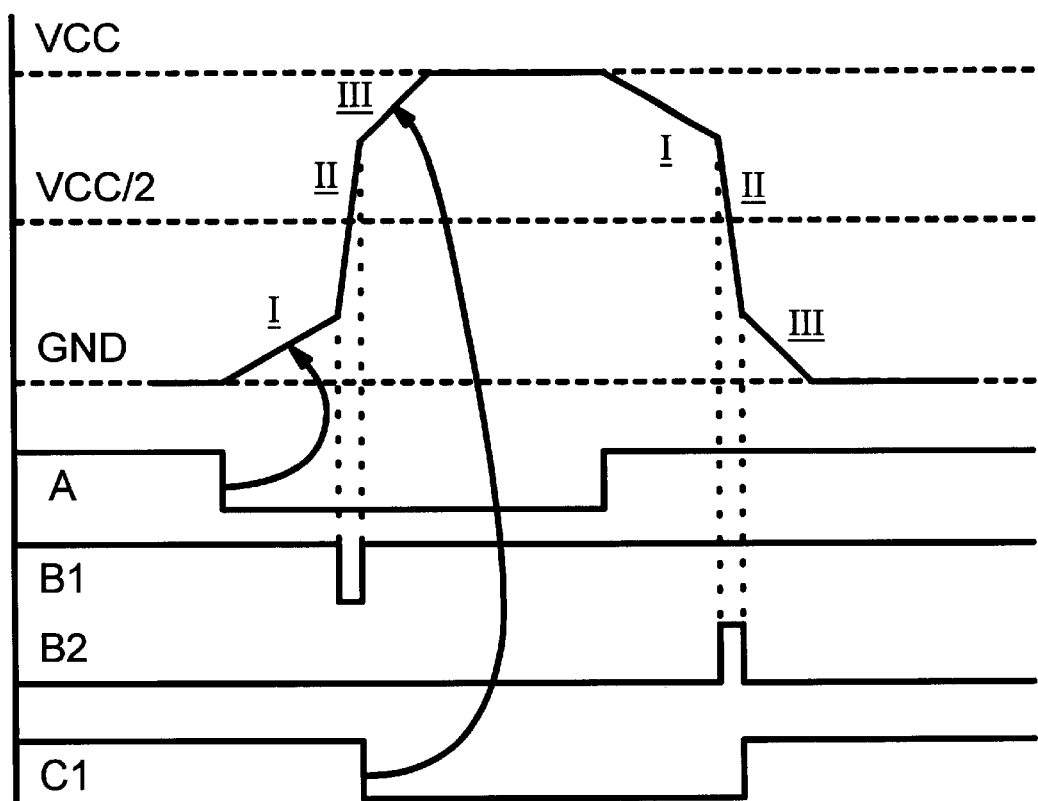
FIG. 5 shows how the triple-slope waveform is generated by the 3-stage clock buffer of FIG. 4.

FIG. 5 shows how the triple-slope waveform is generated by the 3-stage clock buffer of FIG. 4. The CKIN input (not shown) goes high at the beginning of a rising transition, driving node A low. Since node A drives the gates of weak first stage transistors 20, 22, the weak first stage begins to drive the clock output high from ground. This is region I.

The low-going pulse generator is then activated by node A falling. A very short duration pulse is generated, driving a low pulse to the gate of p-channel driver transistor 10 in the second stage. The large size and high current drive of p-channel driver transistor 10 causes the clock output to rise much more rapidly. This is region II. The receiver's switching threshold of Vcc/2 is quickly passed through.

Once the short-duration pulse from the pulse generator ends, the clock slew rate is quickly reduced as region m is entered. Then the output of the delay line, node C1, falls, activating the pullup p-channel transistor 24 in the weak third stage. During the initial phase of region I, weak pull-down transistor 26 is momentarily on while transistor 20 is driving the output high. This overlap helps to reduce the slew rate further. The clock output is pulled up to the power supply, Vcc, by p-channel transistors 20, 24 in the first and third stages.

The falling transition of the clock output begins with CKIN falling, and node A rising. The n-channel transistor 22 in the first stage turns on, region I. Then the high-going pulse generator generates a short-duration pulse to the gate of n-channel driver transistor 12 in the second stage. During this short pulse, the clock output rapidly falls through the switching threshold of Vcc/2 (region II). Then the delay line causes node C1 to rise, turning on n-channel transistor 26 in the third stage. The output then falls more slowly (region E).

Figure 6:
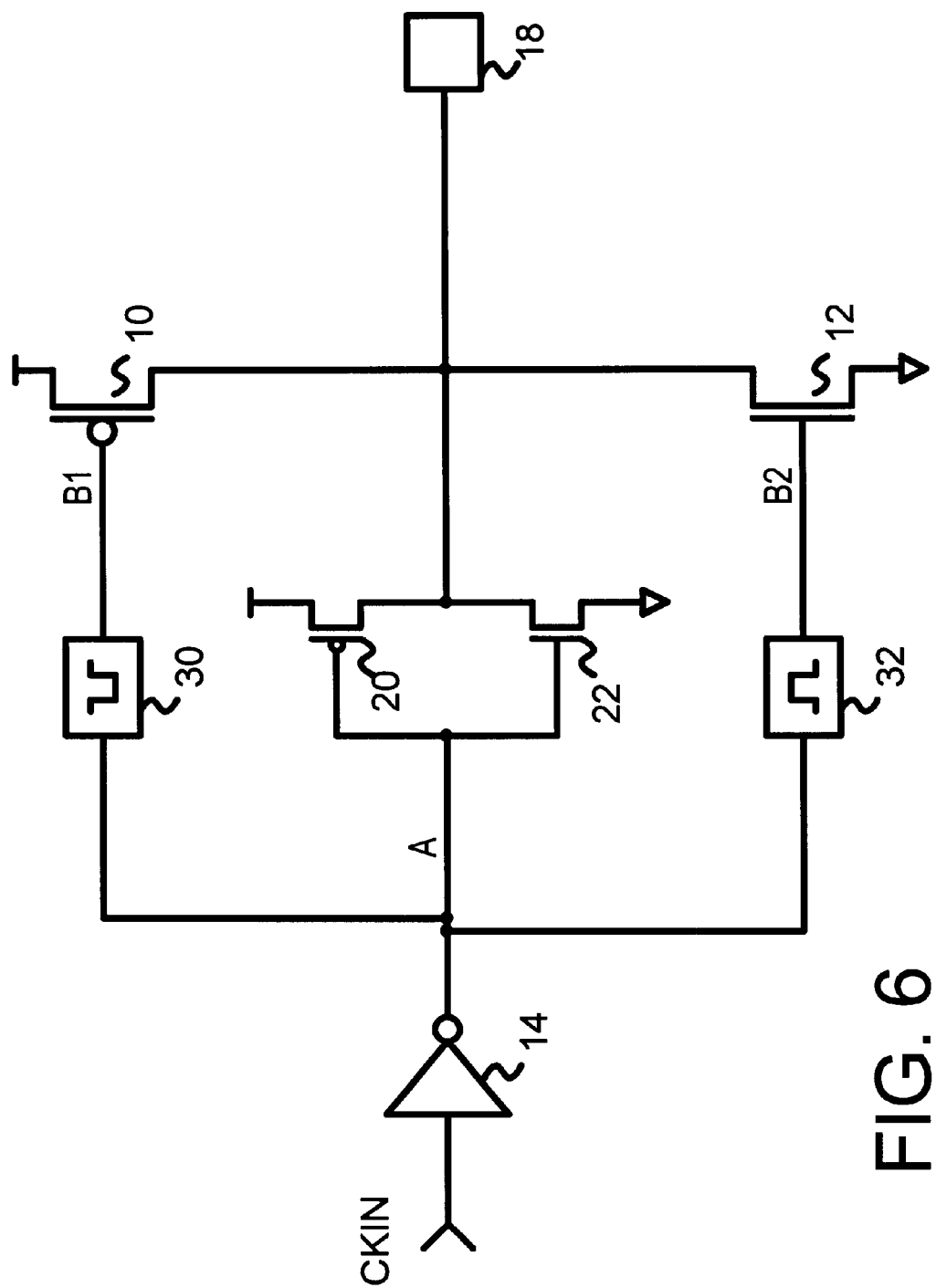
FIG. 6 is a block diagram of a 2-stage clock buffer that produces a clock with a triple-slope waveform.

2-Stage Clock Generator—FIG. 6

FIG. 6 is a block diagram of a 2-stage clock buffer that produces a clock with a triple-slope waveform. The third stage is eliminated in this embodiment. Input CKIN is inverted by inverter 14 to drive weak first stage transistors 20, 22. Weak first stage transistors 20, 22 drive clock output 18, which is a large capacitance clock line.

Pulse generator 30 is activated by the output of inverter 14 (node A) going low, and drives the gate (node B1) of p-channel driver transistor 10. P-channel driver transistor 10 then rapidly drives clock output 18 high during the high-edge-rate region II of the switching waveform. Likewise, pulse generator 32 is activated by the output of inverter 14 (node A) going high, and drives the gate (node B2) of n-channel driver transistor 12. N-channel driver transistor 12 rapidly switches clock output 18 low during region II of the falling transition.

Once pulse generator 30 ends the pulse to large p-channel driver transistor 10, region II ends and region III begins. Clock output 18 continues to be driven by weak first-stage transistor 20 during region III. Weak first stage transistor 20 also drives clock output 18 during phase II.

Figure 7:
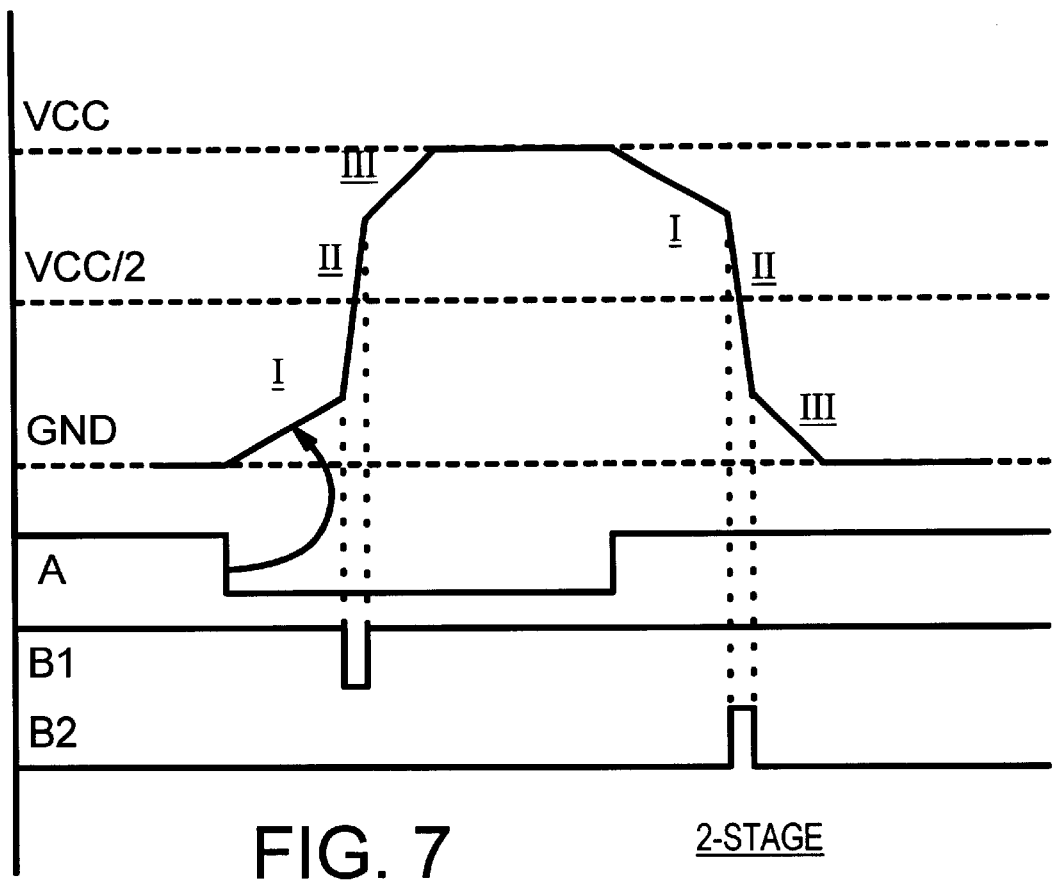
FIG. 7 shows how the triple-slope waveform is generated by the 2-stage clock buffer of FIG. 6.

FIG. 7 shows how the triple-slope waveform is generated by the 2-stage clock buffer of FIG. 6. The CKIN input (not shown) goes high at the beginning of a rising transition, driving node A low. Since node A drives the gates of weak first stage transistors 20, 22, the weak first stage begins to drive the clock output high from ground. This is region I.

The low-going pulse generator 30 is then activated by node A falling. A very short duration pulse is generated, driving a low pulse to the gate of p-channel driver transistor 10 in the second stage. The large size and high current drive of p-channel to driver transistor 10 causes the clock output to rise much more rapidly. This is region II. The receiver's switching threshold of Vcc/2 is quickly passed through.

Once pulse generator 30 ends the pulse to large p-channel driver transistor 10, region II ends and region III begins. The clock slew rate is quickly reduced as region III is entered. The clock output is pulled up to the power supply, Vcc, by p-channel transistor 20 in the first stage. However, since p-channel weak first stage transistor 20 is much weaker in current drive than large driver transistor 10, the slew rate is reduced for region III.

The falling transition of the clock output begins with CKIN falling, and node A rising. The n-channel transistor 22 in the first stage turns on, region I. Then high-going pulse generator 32 generates a short-duration pulse to the gate of n-channel driver transistor 12 in the second stage. During this short pulse, the clock output rapidly falls through the switching threshold of Vcc/2 (region II). Then n-channel transistor 22 in the first stage continues to drive the output low. The output then falls more slowly in region III.

Even though only two stages are used to drive the clock output, a triple-slope waveform is created. This waveform has three slopes because the pulse activating the large driver transistors in the middle region is very short. The pulse ends before the clock-output transition completes.

Figure 8:
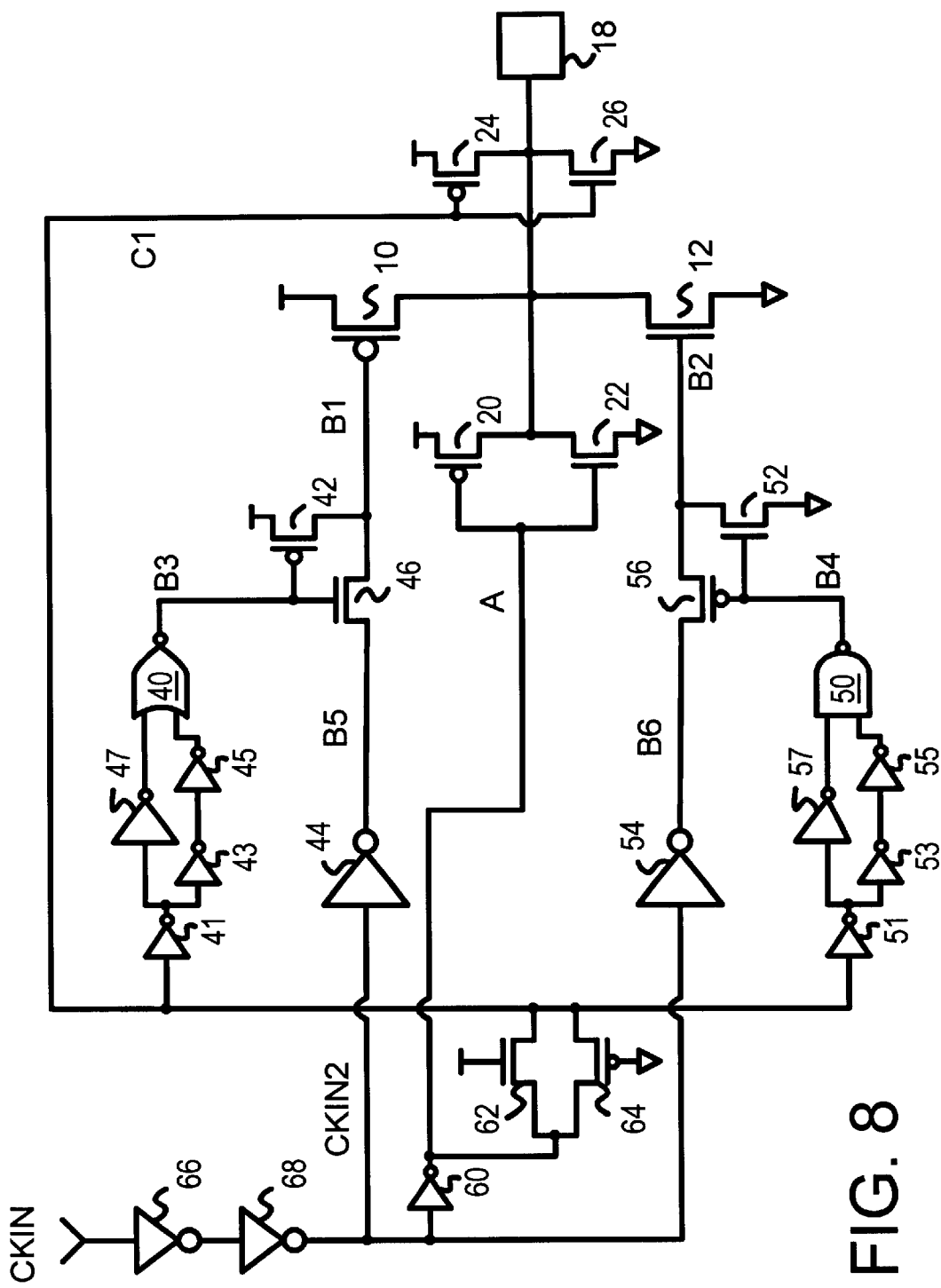
FIG. 8 is a schematic of the 3-stage clock buffer that generates a triple-slope clock waveform for reduced EMI.

3-Stage Buffer Schematic—FIG. 8

FIG. 8 is a schematic of the 3-stage clock buffer that generates a triple-slope clock waveform for reduced EMI. Input CKIN is buffered by inverters 66, 68 to produce node CKIN2. Inverter 60 then inverts CKIN2 to drive node A, which is applied to the gates of weak first stage transistors 20, 22.

Inverter 60, which drives the first stage (node A) from CKIN2, also drives the third stage through delay transistors 62, 64. N-channel delay transistor 62 has its gate connected to power while p-channel delay transistor 64 has its gate connected to ground. Together, delay transistors 62, 64 act as a transmission gate, providing a series resistance between inverter 60 and the gates of third-stage transistors 24, 26, node C1.

Node CKIN2 is also inverted by large inverters 44, 54 to nodes B5, B6 respectively. N-channel pass transistor 46 blocks the enabling signal on node B5 from reaching node B1, which is the gate of large p-channel driver transistor 10 in the second stage. Normally, one of the inputs to NOR gate 40 is a logic 1 and the other is a logic 0, since the two inputs of NOR gate 40 differ only by the number of inversions of CKIN. Thus NOR gate 40 usually outputs a 0 to node B3, the gate of n-channel pass transistor 46, keeping pass transistor 46 off. P-channel disable transistor 42 also has its gate connected to node B3, so it is normally on, pulling gate node Bi high, disabling p-channel driver transistor 10.

When CKIN goes from low to high, NOR gate 40 outputs a short pulse high. The duration or length of the high pulse is determined by the difference between delays through inverter 47 to one input of NOR gate 40, and the delay through inverters 43, 45 to the other input of NOR gate 40. Both paths are buffered from node C1 by inverter 41. The delay difference is kept small by having a difference of only one inverter between the single-inversion path and the 2-inversion path. The device sizes are carefully simulated and tweaked to achieve the desired delay difference.

The short high pulse from NOR gate 40 at node B3 is simultaneously applied to the gates of n-channel pass transistor 46 and p-channel disable transistor 42. This high pulse momentarily turns off p-channel disable transistor 42 and turns on n-channel pass transistor 46. This allows the low signal from node B5 to pass through n-channel pass transistor 46 to node B1. Large inverter 44 has sufficient current drive to quickly discharge the gate of p-channel driver transistor 10 despite the series resistance of n-channel pass transistor 46. Thus p-channel driver transistor 10 turns on during the high pulse from NOR gate 40. The clock output 18 is then driven high quickly with a high voltage-slew rate by p-channel driver transistor 10. This is region II, when the clock output voltage quickly passes through the switching threshold to minimize jitter. Once the high-going pulse from NOR gate 40 ends, n-channel pass transistor 46 turns off and p-channel disable transistor 42 turns on, charging the gate of p-channel driver transistor 10 to the power-supply voltage and turning off p-channel driver transistor 10.

Likewise, p-channel pass transistor 56 normally blocks the enabling signal on node B6 from reaching node B2, which is the gate of large n-channel driver transistor 12 in the second stage. When CKIN switches from high to low, NAND gate 50 outputs a low pulse on node B4. The duration of this low pulse is determined by the difference in delays through inverter 57 and through inverters 53, 55. Inverter 51 buffers node C1 from this pulse generator.

During the low pulse from NAND gate 50, p-channel pass transistor 56 turns on and n-channel disable transistor 52 turns off, allowing large inverter 54 to drive a high from node B6 to node B2. The high on node B2 turns on n-channel driver transistor 12, pulling clock output 18 low rapidly (region II of the waveform). As soon as the low pulse from NAND gate 50 ends, p-channel pass transistor 56 turns off and n-channel disable transistor 52 discharges node B2, turning off n-channel transistor 12.

Figure 9:
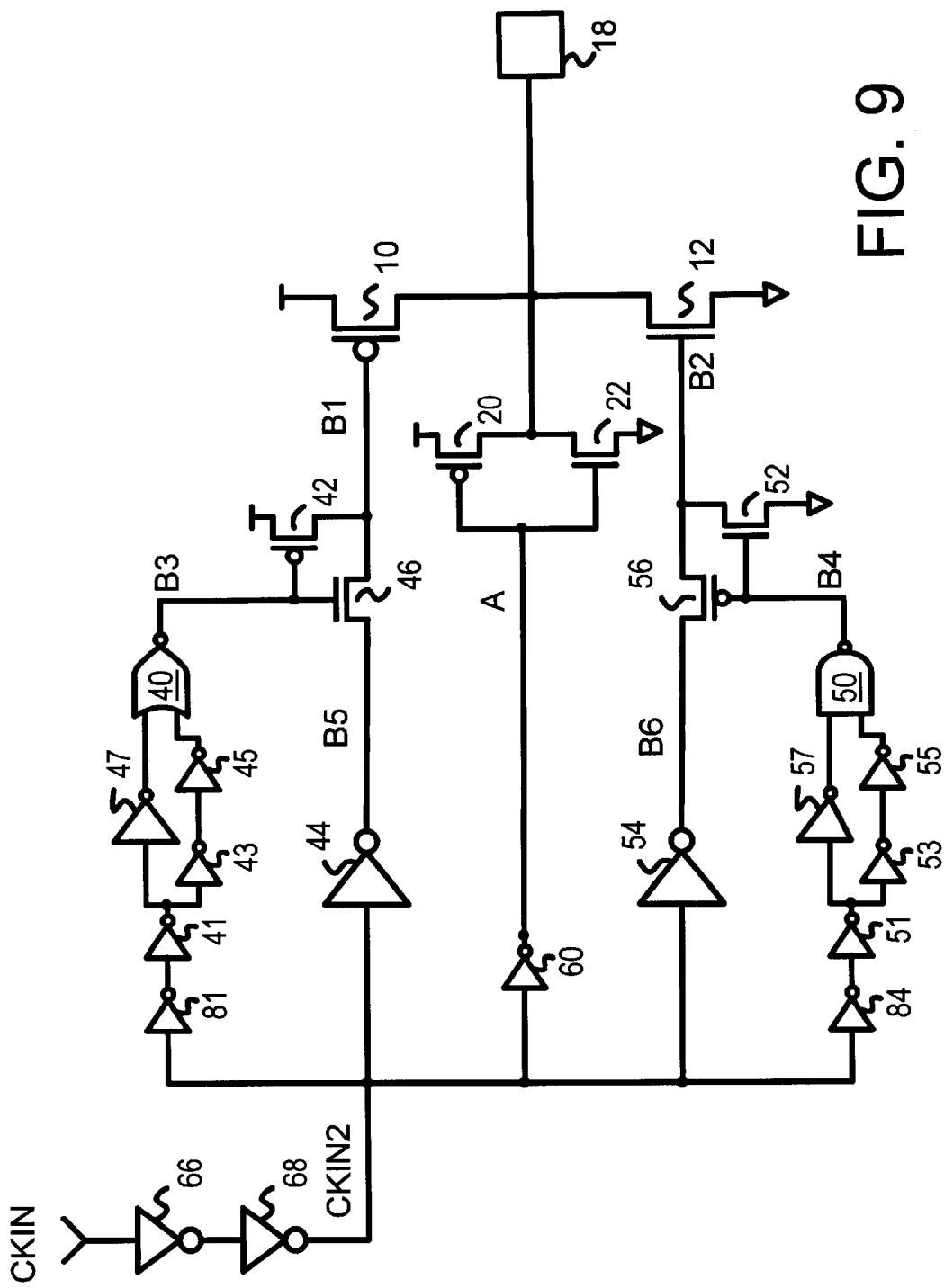
FIG. 9 is a schematic of the 2-stage clock buffer that generates a triple-slope clock waveform for reduced EMI.

2-Stage Buffer Schematic—FIG. 9

FIG. 9 is a schematic of the 2-stage clock buffer that generates a triple-slope clock waveform for reduced EMI. Input CKIN is buffered by inverters 66, 68 to produce node CKIN2. Inverter 60 then inverts CKIN2 to drive node A, which is applied to the gates of weak first stage transistors 20, 22.

Node CKIN2 is also inverted by large inverters 44, 54 to drive nodes B5, B6 respectively. N-channel pass transistor 46 blocks the enabling signal on node B5 from reaching node B1, which is the gate of large p-channel driver transistor 10 in the second stage. NOR gate 40 usually outputs a 0 to node B3, the gate of n-channel pass transistor 46, keeping pass transistor 46 off. P-channel disable transistor 42 also has its gate connected to node B3, so it is normally on, pulling gate node B1 high, disabling p-channel driver transistor 10.

When CKIN goes from low to high, NOR gate 40 outputs a short pulse high. The duration or length of the high pulse is determined by the difference between delays through inverter 47 to one input of NOR gate 40, and the delay through inverters 43, 45 to the other input of NOR gate 40. Both paths are buffered from node CKIN2 by inverters 81, 41. The delay difference is kept small by having a difference of only one inverter between the single-inversion path and the 2-inversion path. The device sizes are carefully simulated and tweaked to achieve the desired delay difference.

The short high pulse from NOR gate 40 at node B3 is simultaneously applied to the gates of n-channel pass transistor 46 and p-channel disable transistor 42. This high pulse momentarily turns off p-channel disable transistor 42 and turns on n-channel pass transistor 46. This allows the low signal from node B5 to pass through n-channel pass transistor 46 to node B1. Large inverter 44 has sufficient current drive to quickly discharge the gate of p-channel driver transistor 10 despite the series resistance of n-channel pass transistor 46. Thus p-channel driver transistor 10 turns on during the high pulse from NOR gate 40. The clock output 18 is then driven high quickly with a high voltage-slew rate by p-channel driver transistor 10. This is region II, when the clock output voltage quickly passes through the switching threshold to minimize jitter. Once the high-going pulse from NOR gate 40 ends, n-channel pass transistor 46 turns off and p-channel disable transistor 42 turns on, charging the gate of p-channel driver transistor 10 to the power-supply voltage and turning off p-channel driver transistor 10.

Likewise, p-channel pass transistor 56 normally blocks the enabling signal on node B6 from reaching node B2, which is the gate of large n-channel driver transistor 12 in the go second stage. When CKIN goes from high to low, NAND gate 50 outputs a low pulse on node B4. The duration of this low pulse is determined by the difference in delay through inverter 57 and through inverters 53, 55. Inverter 84, 51 buffer node CKIN2 from this pulse generator.

During the low pulse from NAND gate 50, p-channel pass transistor 56 turns on and n-channel disable transistor 52 turns off, allowing large inverter 54 to drive a high from node B6 to node B2. The high on node B2 turns on n-channel driver transistor 12, pulling clock output 18 low rapidly (region II of the waveform). As soon as the low pulse from NAND gate 50 ends, p-channel pass transistor 56 turns off and n-channel disable transistor 52 discharges node B2, turning off n-channel transistor 12.

Using just 2 stages rather than 3 stages simplifies the design and timing. The triple-slope waveform is still achieved with only 2 stages, since the second stage is pulsed off before the end of the output transition.

Figure 10:
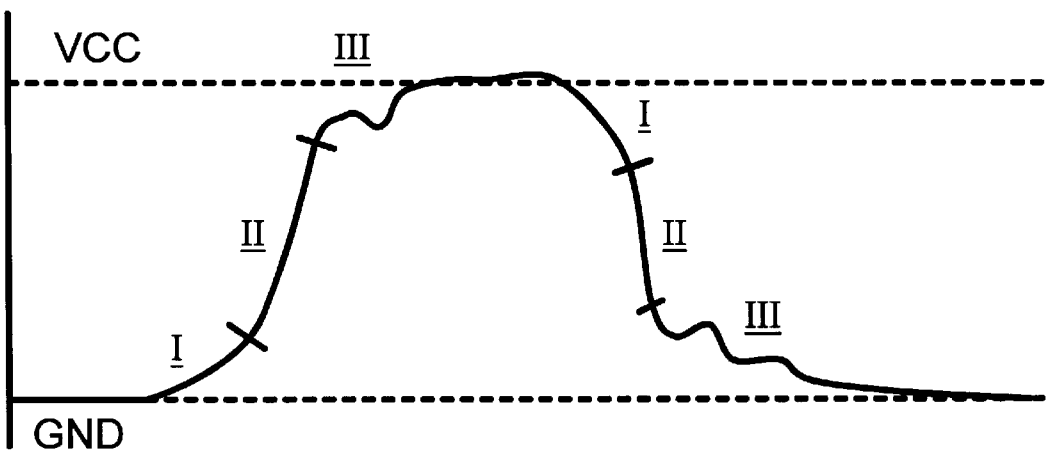
FIG. 10 shows a simulated waveform of the triple-slope clock buffer driving a large clock line.

Simulated Waveform with 3 Slopes—FIG. 10

FIG. 10 shows a simulated waveform of the triple-slope clock buffer driving a large clock line. For the rising edge, region I has a low slope or edge rate of about 0.2 v/ns. This edge rate increases to about 2 v/ns in region II. Then when the large driver turns off, the edge rate drops back to about 0.1 v/ns in region III. The transitions from region I to II and region II to III are somewhat smoothed due to the finite time to turn off the channel in the large driver transistors. The slopes are approximated (measured) as the tangent to the clock output within each region, but EMI depends on the integral of the slope over time.

For the falling edge, in region I the edge rate is −0.2 v/ns, which jumps to −1.7 v/ns in region II, and then returns to −0.1 v/ns in region III. For comparison, a standard single-stage clock buffer could have a single slope for most of the Vcc swing of 2 ns rising and −1.8 v/ns falling. Thus the edge rate is significantly reduced for regions I and III.

Some ringing occurs when the large driver is shut off, at the end of region II and the beginning of region III. Since the large driver is shut off before the power-supply voltage is reached, this ringing is superimposed over the rising region III slope. Likewise, ringing occurs when the large n-channel driver transistor is shut off for the falling transition at the end of region II. This ringing begins to occur before the clock output reaches ground. Having such ringing occur before the power-supply or ground voltages are reached is better because it is better for ringing to occur at a time after the transition but below Vcc or above ground, so that it does not overshoot above Vcc and undershoot below ground.

ADVANTAGES OF THE INVENTION

A clock buffer has high current drive and high speed but reduced EMI. Induced EMI from the fast edge rate is reduced by dynamically controlling the edge rate of the clock buffer to provide high drive and rapid voltage change near the receiver's switching threshold, but lower drive and a slower voltage change for the remainder of the transition. The large driver transistors are pulsed on only during the middle of the transition so that the large driver transistors are off at the start and at the end of the transition.

The clock buffer produces an ideal clock waveform with a rapid voltage change near the receiver's switching threshold, but a slower edge rate to reduce EMI when the clock's voltage is away from the switching threshold. Jitter is reduced because the clock line rapidly moves through the switching threshold, so less time is spent with the clock signal near the critical switching threshold where small noise voltages could falsely trigger receivers. EMI is reduced, since the overall or average edge rate is reduced due to the slower edge rate when the clock signal is not near the switching threshold.

Since the middle region II accounts for only 40 to 60 percent of the transition, the average EMI for the whole transition is reduced. The large driver transistor is enabled during region II, so the large current is able to quickly offset any noise coupled into the clock line.

ALTERNATE EMBODIMENTS

Several other embodiments are contemplated by the inventors. For example many changes to device sizes and logic gates and inversions can be made. The receiver's switching threshold has been approximated as Vcc/2, but other values of the switching threshold can be accommodated. The clock line may drive many receivers having different switching thresholds; however these thresholds are likely within region II. Other device sizes and technologies can be substituted. Other transistors and passive components can be added, and parasitic components are usually present. The driver transistors are usually a few times larger than the weak drive transistors.

Control inputs can be added to modify the clock buffers described herein for three-state or high-Z operation. When the entire buffer is disabled, both pull-up and pull-down transistors are disabled. Changing an inverter into a NAND gate driving the pull-ups and a NOR gate driving the pull-downs with additional disable circuitry for the second stage can accomplish this in a well-known manner. p TTL-level logic uses a switching threshold of about 1.45 volts rather than Vcc/2. TTL can be accommodated by adjusting the size of the pull-up and pull-down transistors in the inverters, or using TTL-to-CMOS level converters. A Schmidt trigger can be substituted for inverters to provide hysteresis. The delay through different paths through the buffer can be increased or decreased with many different circuit techniques.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

APPENDIX-DEVICE SIZES

For purposes of example, below are W/L device sizes in microns for a half-micron CMOS process, for the circuit of FIG. 8.

| Large Driver transistors 10, 12 | 830/0.55 | 415/0.55 |
| Weak first stage transistors 20, 22 | 60/0.55 | 30/0.55 |
| Third-stage transistors 24, 26 | 100/0.55 | 50/0.55 |
| N-channel pass transistor 46 | 20/0.5 | |
| P-channel pass transistor 56 | 40/0.5 | |
| P-channel disable transistor 42 | 20/0.5 | |
| N-channel disable transistor 52 | 5/0.5 | |
| Delay transistors 62, 64 | 5/2 | 10/2 |

For the gates below, sizes are the W/Lp, W/Ln:

| Large Inverter 44 | 100/0.5 | 50/0.5 |
| Large Inverter 54 | 50/0.5 | 25/0.5 |
| NOR gate 40 | 20/0.5 | 5/0.5 |
| Inverter 47 | 10/0.5 | 5/0.5 |
| Inverter 41 | 4/0.5 | 2/0.5 |
| Inverter 43 | 4/1 | 2/1 |
| Inverter 45 | 4/1 | 2/1 |
| NAND gate 50 | 10/0.5 | 10/0.5 |
| Inverter 57 | 10/0.5 | 5/0.5 |
| Inverter 51 | 4/0.5 | 2/0.5 |
| Inverter 53 | 4/0.7 | 2/0.7 |
| Inverter 55 | 4/0.7 | 2/0.7 |
| Inverter 60 | 10/0.5 | 5/0.5 |
| Inverter 66 | 30/0.5 | 15/0.5 |
| Inverter 68 | 60/0.5 | 30/0.5 |

We claim:

1. A pulsed-rive clock buffer comprising:
   a clock output;
   an input indicating when the clock output is to transition;
   an inverter, receiving the input, for driving a weak-gate node;
   a weak p-channel transistor, having a gate connected to the weak-gate node, for driving the clock output high throughout a high-going transition;
   a weak n-channel transistor, having a gate connected to the weak-gate node, for driving the clock output low throughout a low-going transition;
   a first pulse generator, responsive to the input, for generating a low-going pulse;
   a p-channel driver transistor, having a gate connected to the first pulse generator to receive the low-going pulse, for momentarily driving the clock output high during the high-going transition;
   wherein the p-channel driver transistor has a larger current drive than the weak p-channel transistor;
   a second pulse generator, responsive to the input, for generating a high-going pulse; and
   an n-channel driver transistor, having a gate connected to the second pulse generator to receive the high-going pulse, for momentarily driving the clock output low during the low-going transition;
   wherein the n-channel driver transistor has a larger current drive than the weak n-channel transistor;
   wherein the p-channel driver transistor is pulsed on after a start of the high-going transition and is pulsed off before an end of the high-going transition;
   wherein the n-channel driver transistor is pulsed on after a start of the low-going transition and is pulsed off before an end of the low-going transition,
   whereby the driver transistors are pulsed on and off during transitions but the weak transistors drive the clock output for each entire transition and whereby the driver transistors are pulsed on and off in a middle of clock transitions.

2. The pulsed-drive clock buffer of claim 1 wherein the clock output has transitions containing three regions, a first and a third region having a lower voltage-slew rate than a second region that has a higher voltage-slew rate than the lower voltage-slew rate;
   wherein the p-channel driver transistor or the n-channel driver transistor is on during the second region but both are off during the first and third regions,
   whereby a triple-slope waveform of the clock output is produced by pulsing driver transistors on and off within transitions.

3. The pulsed-drive clock buffer of claim 2 wherein ringing occurs on the clock output during the third region, when the n-channel driver transistor is turned off but before the clock output has reached ground, whereby ringing occurs before the low-going transition is completed.

4. The pulsed-drive clock buffer of claim 2 wherein the first and second pulse generators are responsive to the input but have inputs directly coupled to the weak-gate node.

5. The pulsed-drive clock buffer of claim 2 wherein a width of the p-channel driver transistor is at least five times wider than a width of the weak p-channel transistor, wherein the p-channel driver transistor has a much larger current drive than the weak p-channel transistor;

wherein a width of the n-channel driver transistor is at least five times wider than a width of the weak n-channel transistor, wherein the n-channel driver transistor has a much larger current drive than the weak n-channel transistor, whereby the driver transistors are at least five times larger than the weak transistors.

6. The pulsed-drive clock buffer of claim 2 wherein the first pulse generator comprises:

a first large inverter, responsive to the input, for driving a first node;

a first logic gate having two inputs responsive to the input, but one input having an even number of inversions and another input having an odd number of inversions, the first logic gate generating a first pulse;

a first pass transistor, having a gate that receives the first pulse, for coupling the first node to the gate of the p-channel driver transistor to generate a start of the low-going pulse at a start of the first pulse;

a first disable transistor, having a gate that receives the first pulse, for ending the low-going pulse at an end of the first pulse;

wherein the second pulse generator comprises:

a second large inverter, responsive to the input, for driving a second node;

a second logic gate having two inputs responsive to the input, but one input having an even number of inversions and another input having an odd number of inversions, the second logic gate generating a second pulse;

a second pass transistor, having a gate that receives the second pulse, for coupling the second node to the gate of the n-channel driver transistor to generate a start of the high-going pulse at a start of the second pulse; and a second disable transistor, having a gate that receives the second pulse, for ending the high-going pulse at an end of the second pulse, whereby pulses are generated through pass transistors.

7. The pulsed-rive clock buffer of claim 6 wherein the first pass transistor and the second disable transistor are n-channel transistors; and wherein the second pass transistor and the first disable transistor are p-channel transistors.

8. The pulsed-drive clock buffer of claim 7 wherein the first disable transistor, the weak p-channel transistor, and the p-channel driver transistor have sources connected to a power supply;

wherein the second disable transistor, the weak n-channel transistor, and the n-channel driver transistor have sources connected to a ground.

9. A reduced-jitter and reduced-electro-magnetic interference (EMI) clock driver comprising:

a clock input;

a clock output;

a driver p-channel transistor having a source coupled to a power supply and a drain coupled to the clock output and a gate coupled to a first gate node;

a weak p-channel transistor having a source coupled to the power supply and a drain coupled to the clock output and a gate coupled to a weak-gate node;

wherein the weak-gate node is buffered from the clock input by at least one inverter;

a first large inverter for driving a first pass node with an inverse of the clock input;

a first pulsing circuit, responsive to the clock input, for generating a first pulse when the clock input changes from low to high logic states;

a first pass transistor, having a gate receiving the first pulse, for connecting the first pass node to the first gate node in response to the first pulse;

a first disable transistor, coupled to the first gate node, for driving a disabling voltage onto the first gate node when the first pulse is not active;

a driver n-channel transistor having a source coupled to a ground and a drain coupled to the clock output and a gate coupled to a second gate node;

a weak n-channel transistor having a source coupled to the ground and a drain coupled to the clock output and a gate coupled to the weak-gate node;

a second large inverter for driving a second pass node with an inverse of the clock input;

a second pulsing circuit, responsive to the clock input, for generating a second pulse when the clock input changes from high to low logic states;

a second pass transistor, having a gate receiving the second pulse, for connecting the second pass node to the second gate node in response to the second pulse; and a second disable transistor, coupled to the second gate node, for driving a disabling voltage onto the second gate node when the second pulse is not active, whereby driver transistors are pulsed.

10. The reduced-jitter and reduced EMI clock driver of claim 9 wherein pulsing the driver n-channel and p-channel transistors reduces jitter near a mid-point of a transition by increasing a voltage-slew rate near the mid-point, but reduces overall EMI by disabling the n-channel and p-channel driver transistors before and after the mid-point, whereby jitter and EMI are reduced.

11. The reduced-jitter and reduced EMI clock driver of claim 9 wherein the driver n-channel transistor has a larger current drive than the weak n-channel transistor;

wherein the driver p-channel transistor has a larger current drive than the weak p-channel transistor.

12. The reduced-jitter and reduced EMI clock driver of claim 11 wherein the first pass transistor is an n-channel transistor;

wherein the first disable transistor is a p-channel transistor having a source coupled to the power supply;

wherein the second pass transistor is a p-channel transistor;

wherein the second disable transistor is an n-channel transistor having a source coupled to the ground.

13. The reduced-jitter and reduced EMI clock driver of claim 12 further comprising:

a third-stage p-channel transistor, having a source coupled to the power supply and drain coupled to the clock output and a gate connected to a delayed node;

a third-stage n-channel transistor, having a source coupled to the ground and drain coupled to the clock output and a gate connected to a delayed node;

a delay element, responsive to the clock input, for generating the delayed node, whereby three stages of output drivers drive the clock output with varying delays.

14. The reduced-jitter and reduced EMI clock driver of claim 13 wherein the delay element comprises:

a delay inverter receiving the clock input;

an n-channel pass transistor, having a gate connected to the power supply, for connecting an output of the delay inverter to the delayed node;

a p-channel pass transistor, having a gate connected to the ground, for connecting the output of the delay inverter to the delayed node.

15. The reduced-jitter and reduced EMI clock driver of claim 14 wherein the first pulsing circuit and the second pulsing circuit have inputs connected to the delayed node;

wherein the first and second large inverters have inputs connected to the clock input;

wherein the weak-gate node is the output of the delay inverter.

16. A triple-slope clock driver comprising:

clock output means for distributing a clock signal to receivers;

input means for indicating when transitions are to occur on the clock output means;

first pulse means, responsive to the input means, for generating a first pulse on a first gate node when the input means indicates that a high-going transition of the clock output means is to occur;

pullup driver transistor means, coupled to the first gate node, for driving the clock output means high during a middle region of the high-going transition of the clock output means, the pullup driver transistor means not driving the clock output means during an initial region nor during a final region of the high-going transition;

weak pullup transistor means, responsive to the input means, for driving the clock output means high during the initial, middle, and final regions of the high-going transition;

wherein the weak pullup transistor means produces a smaller current than the pullup driver transistor means during the middle region;

second pulse means, responsive to the input means, for generating a second pulse on a second gate node when the input means indicates that a low-going transition of the clock output means is to occur;

pulldown driver transistor means, coupled to the second gate node, for driving the clock output means low during a middle region of the low-going transition of the clock output means, the pulldown driver transistor means not driving the clock output means during an initial region nor during a final region of the low-going transition; and weak pulldown transistor means, responsive to the input means, for driving the clock output means low during the initial, middle, and final regions of the low-going transition;

wherein the weak pulldown transistor means produces a smaller current than the pulldown driver transistor means during the middle region;

wherein a voltage-slew rate of the clock signal during the middle region is larger than voltage slew rates of the clock signal during the initial and final regions, whereby a triple-slope waveform for the clock signal is generated.

17. The triple-slope clock driver of claim 16 wherein the pullup driver transistor means and the weak pullup transistor means are p-channel transistors with sources coupled to a power supply and drains coupled to the clock output means;

wherein the pulldown driver transistor means and the weak pulldown transistor means are n-channel transistors with sources coupled to a ground and drains coupled to the clock output means.

18. The triple-slope clock driver of claim 17 wherein the first pulse means comprises:

first large inverter means, responsive to the input means, for driving a first node;

first logic gate means, having two inputs responsive to the input means, but one input having an even number of inversions and another input having an odd number of inversions, for generating a third pulse;

first pass transistor means, having a gate that receives the third pulse, for coupling the first node to a gate of the pullup driver transistor means to generate a start of the first pulse at a start of the third pulse;

first disable transistor means, having a gate that receives the third pulse, for ending the first pulse at an end of the third pulse;

wherein the second pulse means comprises:

second large inverter means, responsive to the input means, for driving a second node;

second logic gate means, having two inputs responsive to the input means, but one input having an even number of inversions and another input having an odd number of inversions, for generating a fourth pulse;

second pass transistor means, having a gate that receives the fourth pulse, for coupling the second node to the gate of the pulldown driver transistor means to generate a start of the second pulse at a start of the fourth pulse; and second disable transistor means, having a gate that receives the fourth pulse, for ending the second pulse at an end of the fourth pulse, whereby pulses are generated through pass transistors.

19. The triple-slope clock driver of claim 18 wherein ringing occurs on the clock output means during the final region, when pulldown driver transistor means is turned off but before the clock signal has reached ground, whereby ringing occurs before the low-going transition is completed.

* * * * *